(12) United States Patent
Bicksler

(10) Patent No.: US 7,978,511 B2
(45) Date of Patent: Jul. 12, 2011

(54) DATA LINE MANAGEMENT IN A MEMORY DEVICE

(75) Inventor: Andrew Bicksler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 12/473,636

(22) Filed: May 28, 2009

(65) Prior Publication Data

US 2010/0302858 A1 Dec. 2, 2010

(51) Int. Cl.
  *G11C 11/34* (2006.01)
  *G11C 16/04* (2006.01)
  *G11C 16/06* (2006.01)
(52) U.S. Cl. ......... 365/185.02; 365/185.17; 365/185.18; 365/185.23; 365/185.28
(58) Field of Classification Search ............. 365/185.02, 365/185.17, 185.18, 185.23, 185.28
See application file for complete search history.

(56) References Cited

U.S. PATENT DOCUMENTS

| | | | |
|---|---|---|---|
| 2006/0140011 A1* | 6/2006 | Fong et al. | 365/185.29 |
| 2008/0180998 A1* | 7/2008 | Chen | 365/185.02 |
| 2008/0219059 A1* | 9/2008 | Li | 365/185.29 |
| 2008/0259684 A1* | 10/2008 | Shlick et al. | 365/185.03 |
| 2009/0237999 A1* | 9/2009 | Li | 365/185.12 |

OTHER PUBLICATIONS

Chandrasekhar, "Memory Device Biasing Method and Apparatus", U.S. Appl. No. 12/265,989 filed Nov. 6, 2008, 29 pgs.

* cited by examiner

*Primary Examiner* — Ly D Pham
(74) *Attorney, Agent, or Firm* — Leffert Jay & Polglaze, P.A.

(57) ABSTRACT

Methods for programming a memory device, memory devices configured to perform the disclosed programming methods, and memory systems having a memory device configured to perform the disclosed programming methods are provided. According to at least one such method, multiple pages of memory cells are inhibited during a programming operation such that memory cells enabled for programming are separated by two or more inhibited memory cells of the same row of memory cells regardless of the intended pattern of data states to be programmed into that row of memory cells.

11 Claims, 6 Drawing Sheets

DATA LINE MANAGEMENT IN A MEMORY DEVICE

TECHNICAL FIELD OF THE INVENTION

The present disclosure relates generally to semiconductor memory and, in particular, in one or more embodiments, the present disclosure relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR Flash and NAND Flash. The designation is derived from the logic used to read the devices. FIG. 1 illustrates a NAND type flash memory array architecture 100 wherein the floating gate memory cells 102 of the memory array are logically arranged in an array of rows and columns. In a conventional NAND Flash architecture, "rows" refers to memory cells having commonly coupled control gates, while "columns" refers to memory cells coupled as a particular NAND string, for example. The memory cells 102 of the array are arranged together in strings (e.g., NAND strings), typically of 8, 16, 32, or more each. Each memory cell of a string are connected together in series, source to drain, between a source line 114 and a data line 116, often referred to as a bit line. The array is accessed by a row decoder (not shown) activating a logical row of memory cells by selecting a particular access line, often referred to as a word line, such as WL7-WL0 $118_7$-$118_0$, for example. Each word line is coupled to the control gates of a row of memory cells. Bit lines BL1-BL7 116 can be driven high or low depending on the type of operation being performed on the array. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two levels, two bits by four levels, three bits by eight levels, etc. MLC memory cells may store even or odd numbers of bits on each memory cell. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc.

FIG. 2 illustrates an example of Vt ranges 200 for a MLC (four-level) (e.g., 2-bit) memory cell. For example, a memory cell might be assigned a Vt that falls within one of four different Vt ranges 202-208 of 200 mV, each being used to represent a data state corresponding to a bit pattern comprised of two bits. Typically, a dead space 210 (which is sometimes referred to as a margin) of 200 mV to 400 mV is maintained between each range 202-208 to keep the ranges from overlapping. As an example, if the voltage stored on a memory cell is within the first of the four Vt ranges 202, the cell in this case is storing a logical '11' state and is typically considered the erased state of the cell. If the voltage is within the second of the four Vt ranges 204, the cell in this case is storing a logical '10' state. A voltage in the third Vt range 206 of the four Vt ranges would indicate that the cell in this case is storing a logical '00' state. Finally, a Vt residing in the fourth Vt range 208 indicates that a logical '01' state is stored in the cell.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the floating gates of the block of memory cells. This typically results in the Vt of memory cells to reside in the Vt range 202 (e.g., erased state) of FIG. 2, for example.

Programming typically involves applying one or more programming pulses to a selected word line and thus to the control gate of each memory cell coupled to the selected word line. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the floating gates of memory cells targeted for programming. More specifically, the floating gates are typically charged through direct injection or Fowler-Nordheim tunneling of electrons from the channel to the floating gate, resulting in a Vt typically greater than zero in a programmed state, such as in Vt ranges 204-208 of FIG. 2, for example. In addition, an inhibit voltage is typically applied to bit lines not coupled to a NAND string containing a memory cell that is targeted for programming.

Typically, alternating bit lines are enabled and/or inhibited during a write (e.g., programming) and/or a read operation performed on a selected row of memory cells. However, during a programming operation, an effect which is known as program disturb can occur. For example, during a programming operation, some memory cells coupled to the selected word line may reach their assigned threshold voltage before other memory cells coupled to the same word line reach their assigned threshold voltages. This condition is especially likely to occur in MLC memory. For example, one or more memory cells of a particular row might have an intended threshold voltage within range 204 and others may have an intended threshold voltage within range 208, for example.

Thus it is possible that the memory cells intended to have the programming level 204 will be programmed before the memory cells intended to have the 208 programming level, for example. The continued application of programming pulses (such as to complete programming of one or more memory cells of a row) to a selected word line can cause these program disturb issues. This is because memory cells which have reached their intended programming levels and are inhibited from programming can still experience a shift in their threshold voltage due to the continued application of programming pulses to the selected word line, for example.

For the reasons stated above, and for other reasons stated below which will become apparent to those skilled in the art upon reading and understanding the present disclosure, there is a need in the art for a way to reduce the effects of program disturb in flash memory devices.

DETAILED DESCRIPTION

Figure 1:
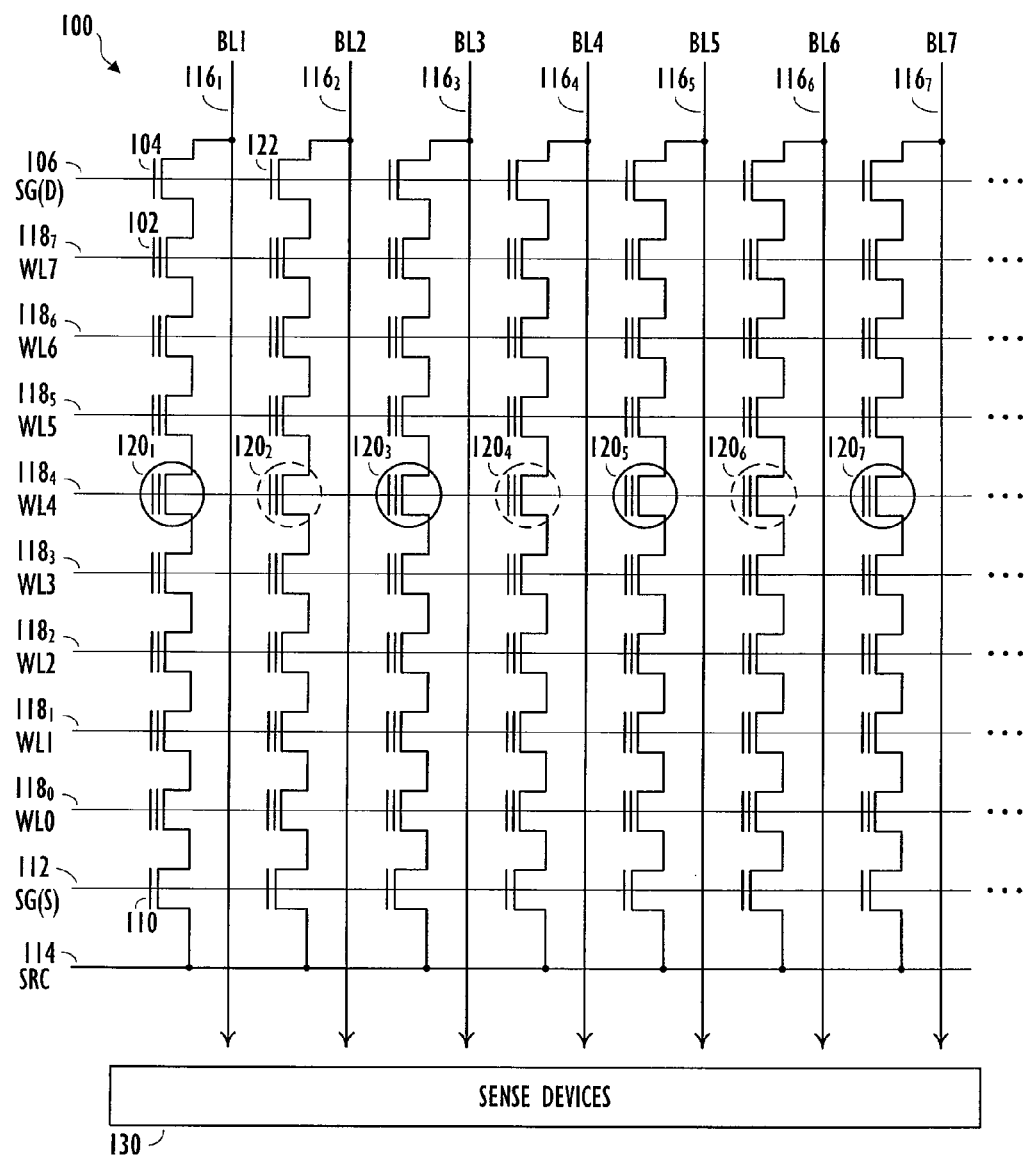
FIG. 1 shows an array of NAND configured memory cells.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates an example where a particular row of memory cells 120 coupled by WL4 $118_4$ has been selected for programming as indicated by the circles around the memory cells. During a typical programming operation, alternate bit lines are biased in such a way as to allow the programming of memory cells 120 coupled to alternating bit lines. For example, in a first programming operation of WL4 $118_4$, memory cells coupled to even numbered bit lines (e.g., indicated by dashed line circles surrounding memory cells $120_{2,4,6}$) are programmed. During this operation, the odd numbered bit lines are biased such that the memory cells 120 coupled to the odd bit lines (e.g., indicated by solid line circles surrounding $120_{1,3,5,7}$) are inhibited from programming. For example, the even numbered bit lines might be driven to a low (e.g., ground) potential and the odd bit lines might be driven to a non-zero potential, such as a supply voltage (Vcc.) Vcc according to one or more embodiments of the present disclosure might be 1.8V to 2.5V, for example. Following the programming operation of memory cells coupled to the even numbered bit lines, those bit lines are biased at a level (e.g., Vcc) to inhibit further programming of the memory cells coupled to those bit lines. The odd numbered bit lines are then biased (e.g., to 0V) to allow programming of memory cells $120_{1,3,5,7}$ coupled to those bit lines.

During a typical read operation of the memory array 100, NAND strings of memory cells coupled to even numbered bit lines (e.g., BL2, BL4, BL6 $116_{2,4,6}$) are read, followed by a read operation of the NAND strings coupled to odd numbered bit lines (e.g., BL1, BL3, BL5, BL7 $116_{1,3,5,7}$.) During a read operation, bit lines coupled to memory cells selected to be read (e.g., even/odd) are precharged to a particular bias level, such as 0.5V, for example. A read operation may be performed on memory cells $120_{1-7}$ of the row (e.g., word line) WL4 $118_4$, for example.

Bit lines BL1-BL7 116 are coupled to sense devices (e.g., sense amplifiers) 130 that detect the state of a target memory cell by sensing voltage or current on a particular bit line 116. Word lines WL7-WL0 118 select the individual memory cells (e.g., 120) in the series strings to be written to, verified or read from and operate the remaining memory cells in each series string in a pass through mode. Each series string of memory cells is coupled to a source line 114 by a source select gate, such as 110 and to an individual bit line 116 by a drain select gate 104, for example. The source select gates, such as 1 10, are controlled by a source select gate control line SG(S) 112 coupled to their control gates. The drain select gates, such as 104, are controlled by a drain select gate control line SG(D) 106.

The memory cells of the selected row and coupled to the odd bit lines can be considered a logical page of memory as are the memory cells of the selected row that are coupled to the even numbered bit lines. The two logical pages of memory cells are typically referred to as Page 0 and Page 1 of a particular row of memory cells. For example, the memory cells coupled to the even numbered bit lines (e.g., indicated by solid line circles $120_{1,3,5,7}$) might be referred to as Page 0 memory cells. Whereas the memory cells coupled to the odd numbered bit lines (e.g., indicated by dashed line circles $120_{2,4,6}$) might be referred to as Page 1 memory cells, for example. Thus, during a typical programming operation, the Page 0 memory cells are programmed while the Page 1 memory cells are inhibited from programming. This is followed by a programming operation wherein the Page 0 memory cells are inhibited and the Page 1 memory cells are programmed. Enabling and inhibiting pages (e.g., Page 0, Page 1) of memory cells is accomplished, at least in part, by selectively biasing the bit lines 116 coupled to each page of memory cells.

As discussed above, an effect that is typically undesirable, and often referred to as program disturb, can occur while programming Page 0 memory cells while the Page 1 memory cells are inhibited from programming and vice versa, for example. These disturb effects can affect the programming of a memory cell which has already achieved its intended programming level and is nearby (e.g., adjacent) to a memory cell that is currently being programmed, for example.

Figure 3:
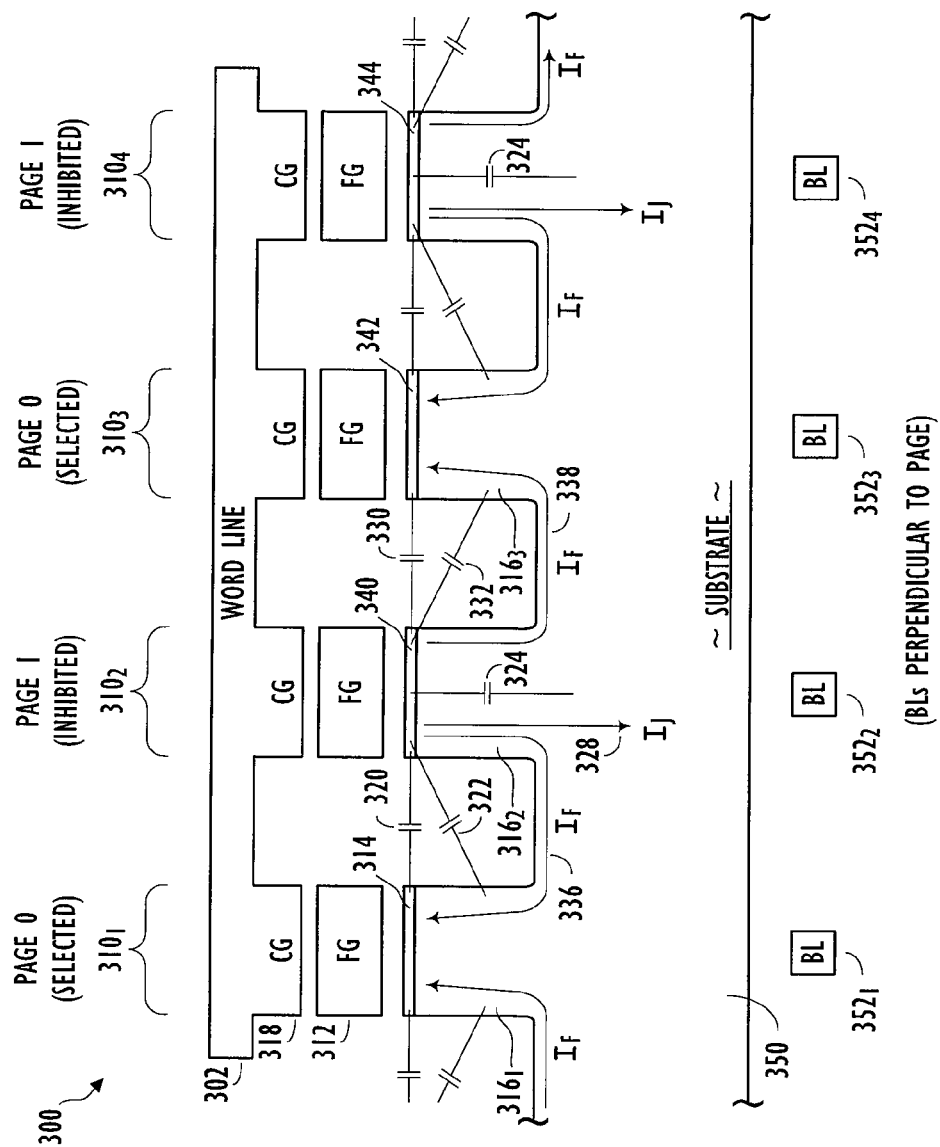
FIG. 3 shows parasitic effects which might occur in an array of flash memory cells.

FIG. 3 illustrates an example of these disturb effects with respect to a selected row 300 of memory cells 310, such as WL4 $118_4$ of FIG. 1, for example. The row of memory cells 310 shown in FIG. 3 might be representative of memory cells 120 coupled to WL4 of FIG. 1, for example. Four floating gate memory cells (e.g., flash memory cells) are represented in FIG. 3. For example, each memory cell 310 of FIG. 3 is shown comprising a control gate (CG) 318, floating gate (FG) 312 and channel region 314. Although not shown, insulating material (e.g., oxide) is also present between each memory cell 310 and also the individual structures of each memory cell 310. For example, an insulating material would be present between the control gate 318, floating gate 312 and channel region 314 of each memory cell structure 310 as is well understood. The control gates of each memory cell 310 are coupled together by the word line 302, such as WL4 $118_4$, for example.

The memory cells 310 are further shown formed having the body region 316 of each memory cell formed on a substrate 350. Memory cell $310_1$ might correspond to memory cell $120_1$, memory cell $310_2$ to memory cell $120_2$, memory cell $310_3$ to memory cell $120_3$ and memory cell $310_4$ to memory cell $120_4$, for example. Bit lines 352 are also shown in order to provide a relative orientation of the structure of the memory cells shown in FIG. 3. For example, bit lines 352 would project into/out of the plane of the illustration of FIG. 3. Bit lines 352 for example correspond to the bit lines 116 shown in FIG. 1. Bit line $352_1$ corresponds to BL1 $116_1$, bit line $352_2$ corresponds to BL2 $116_2$, bit line $352_3$ corresponds to BL3 $116_3$ and bit line $352_4$ corresponds to BL4 $116_4$, for example. It should be noted that the memory cells 310 shown in FIG. 3 have been simplified in order to improve readability of the Figure and that many more memory cells may be coupled to the word line 302. Additionally, some structural regions of the memory cells 310 (e.g., source/drain regions) have been omitted from FIG. 3 to improve readability. In addition, memory cells of NAND strings which are not selected for programming, such as memory cells of the same NAND string of cells 310 but are coupled to word lines other than the selected word line (e.g., not coupled to WL4 $118_4$) are also not shown in FIG. 3.

FIG. 3 illustrates an example of programming conditions during a typical programming operation wherein Page 0 memory cells $310_{1,3}$ are selected for programming and Page 1 memory cells $310_{2,4}$ are to be inhibited from programming. For example, the bit lines $352_{1,3}$ which are coupled (coupling not shown) to the Page 0 memory cells $310_{1,3}$ might be biased to a ground potential and the bit lines $352_{2,4}$ which are coupled (coupling not shown) to the Page 1 memory cells $310_{2,4}$ might be biased to Vcc, for example.

In the example illustrated in FIG. 3, the Page 1 memory cells $310_{2,4}$ might have already been programmed to their intended programming levels during a previous programming operation. For example, the Page 0 memory cells $310_{1,3}$ would have been inhibited (e.g., by biasing bit lines $352_{1,3}$ to Vcc) while the Page 1 memory cells $310_{2,4}$ were being programmed. FIG. 3 illustrates various capacitances (e.g., parasitic capacitances) which might exist during a programming operation performed on Page 0 memory cells $310_{1,3}$. The channel regions of the Page 0 memory cells which are noted as being selected, are biased to a ground potential by way of driving their respective coupled bit lines to a ground potential (not shown) as discussed above. The channel regions of the Page 1 memory cells which are noted as being inhibited, are not biased to a low potential due to the biasing of their respective bit lines to Vcc, for example. As a result of the Page 1 bit lines being biased to Vcc, this effectively causes the channel regions of the Page 1 memory cells to float and are not necessarily driven to the bias (e.g., Vcc) imposed on their respective Page 1 bit lines. This can be explained by way of reference to FIG. 1. For example, the drain select gate 104 is enabled due to the ground potential present on the BL1 bit line $116_1$ and a bias of approximately 2.5V present on the SG(D) 106 signal line coupled to the gate of drain select gate 104. Unselected word lines of the array are typically driven to a voltage (e.g., pass voltage) rendering them conductive but not high enough to cause programming of the memory cells coupled to unselected word lines. For example, unselected word lines (e.g., WL7-WL5 and WL3-WL0) might be biased at 13V while a programming voltage pulse applied to the selected word line (e.g., WL4) might be in the range of 15V to 24V, for example. Thus, the channel region of the memory cells selected for programming, such as the Page 0 memory cells of FIG. 3 and memory cells $120_{1,3,5,7}$, are biased to the ground potential present on the Page 0 bit lines, such as BL1,3,5,7 $116_{1,3,5,7}$, for example. The bit lines associated with Page 1 memory cells, such as BL2 $116_2$, is biased with an inhibit voltage such as Vcc as discussed above. In this case, the drain select gate 122 is not enabled due to the bias present on BL2,4,6 $116_{2,4,6}$ and this renders the channel regions of the Page 1 memory cells, such as $310_{2,4}$ to be in a floating state.

During the application of a programming pulse to the selected word line 302, there exists a sufficient voltage difference between the channel regions of the Page 0 memory cells, which are driven to a low potential as just described, and the word line 302 providing the programming pulse to cause programming of the Page 0 memory cells to occur. For example, the selected word line 302 might be driven to 18V and the channel regions of the Page 0 memory cells are at a potential of 0V. This yields a differential voltage of 18V which is sufficient to cause programming to occur in the Page 0 memory cells. As memory cells of the same row are each coupled to the same word line, the programming potential provided on the word line 302 also drives the control gates of the inhibited Page 1 memory cells $310_{2,4}$. However, the channel regions of the inhibited Page 1 memory cells are floating as a result of the biasing (e.g., to Vcc) of their respective bit lines and as discussed above, the channel regions of these inhibited cells are pulled up by some amount. For example, again the word line 302 might be biased to 18V, however as the channel regions of Page 1 memory cells are floating, the channel regions of the inhibited Page 1 memory cells might be pulled up to a level of 6V-10V, for example.

As the channel regions of the selected Page 0 memory cells are biased to approximately 0V and the channel regions of the inhibited Page 1 memory cells are at a bias level of approximately 6V-10V as discussed above, a potential difference exists between the channel regions of the Page 1 and the Page 0 memory cells (e.g., between channel regions 342 and 344) of approximately 6V-10V, for example. As a result, there are parasitic capacitances (e.g., 320, 322, 324, 330, 332) and parasitic currents (e.g., 336, 328, 338) which exist between the selected and inhibited memory cells. These parasitic capacitances and currents (e.g., $I_F$ 336, 338 and $I_J$ 328) can cause program disturb issues in the inhibited memory cells, such as the previously programmed Page 1 memory cells $310_{2,4}$, for example.

Channel to channel parasitic capacitances 320 and 330 exist between the channel regions of inhibited Page 1 memory cells $310_{2,4}$ and the adjacent selected Page 0 memory cells $310_{1,3}$. Capacitances 322 and 332 represent distributed parasitic capacitances between the channel region of an inhibited memory cell, such as $310_2$, and the body region $316_{1,3}$ below the channel regions of the selected Page 0 memory cells adjacent to the inhibited memory cell. In addition, a parasitic capacitance 324 can also exist between the channel region of each inhibited memory cell and the substrate 350, for example.

Parasitic currents 336, 338 can also occur in addition to the parasitic capacitances described above. A possible parasitic current 336, 338 can flow from the channel region 340 and body region $316_2$ of the inhibited cell $310_2$ to the channel region 314,342 and body region $316_{1,3}$ of an adjacent selected memory cell $310_{1,3}$, for example. An additional parasitic current 328 can also flow from the channel region 340 and body region $316_2$ of an inhibited memory cell $310_2$ into the substrate 350 as well.

Various embodiments of the present disclosure provide methods and apparatus to reduce the effects of the parasitic capacitances and parasitic currents described with respect to FIG. 3 and thereby reducing the effects of program disturb in a memory device, for example.

Figure 4:
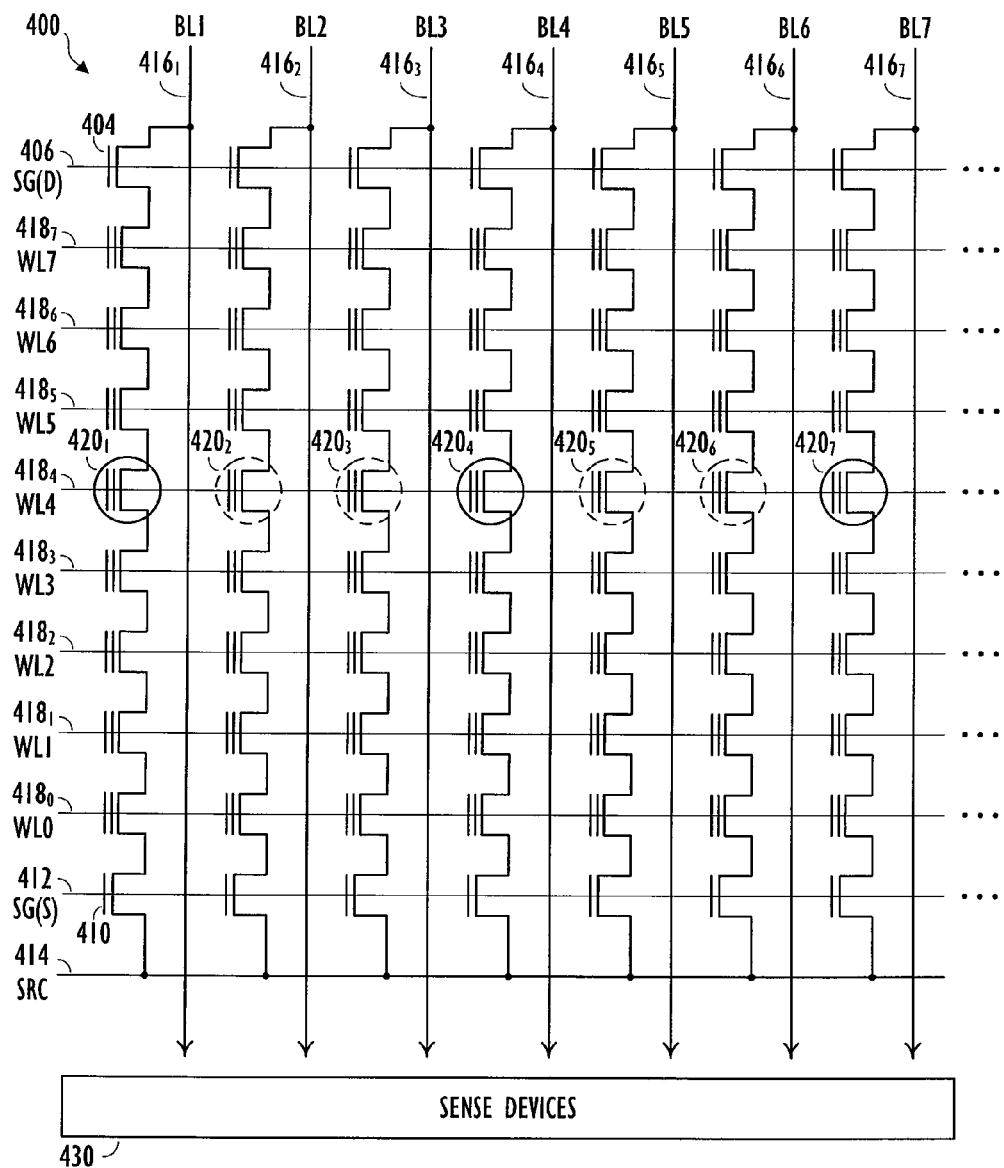
FIG. 4 shows an array of NAND configured memory cells according to an embodiment of the present disclosure.

FIG. 4 illustrates an array 400 of memory cells according to an embodiment of the present disclosure. A row of memory cells 420 has been selected for programming as is indicated by the circled memory cells coupled to WL4 $418_4$. In contrast with the programming operation discussed above with respect to FIG. 1, the programming operation illustrated by FIG. 4 according to one or more embodiments of the present disclosure facilitates having two or more inhibited memory cells of a selected row between memory cells selected (e.g., currently selected or targeted) for programming, regardless of the intended pattern of data states to be programmed into the selected row of memory cells. For example, memory cells $420_{1,4,7}$ are selected for programming as indicated by the solid circles around these memory cells. Memory cells $420_{2,3,5,6}$ are inhibited from programming as indicated by the dashed circles around those memory cells. According to one or more embodiments of the present disclosure, the data lines coupled to memory cells to be inhibited might be biased to the same potential, such as Vcc, for example. In addition, one or more embodiments of the present disclosure might bias data lines coupled to memory cells to be inhibited to different potentials that each inhibit programming. Additional embodiments might inhibit more than two memory cells between selected memory cells according to one or more embodiments of the present disclosure. Many more rows, columns and memory cells might exist than are shown in FIG. 4. Thus, one or more embodiments of the present disclosure utilize three or more logical pages of memory cells per row. For example, memory cells $420_{1,4,7}$ might comprise Page 0 memory cells of row WL4 $418_4$. Memory cells $420_{2,5}$ might comprise Page 1 memory cells of row WL4 $418_4$. Memory cells $420_{3,6}$ might comprise Page 2 memory cells of row WL4 $418_4$, and so on.

Following programming of the Page 0 memory cells of WL4, the Page 1 memory cells might be selected (e.g., enabled) for programming while the Page 0 and Page 2 memory cells are inhibited. Following the programming of the Page 1 memory cells, the Page 2 memory cells might then be selected (e.g., enabled) for programming and the Page 0 and Page 1 memory cells are inhibited. Thus, according to one or more embodiments there will be at least two inhibited memory cells located between two memory cells selected (e.g., enabled) for programming, regardless of the intended pattern of data states to be programmed into a row of memory cells containing the two memory cells selected for programming. As discussed above, various embodiments of the present disclosure are not limited to three logical pages (e.g., Page 0, Page 1 and Page 2) of memory cells. Although not shown in FIG. 4 various embodiments of the present disclosure might comprise a memory array having four logical pages (e.g., Page 0, Page 1, Page 2 and Page 3) of memory cells per row, for example. In at least one such embodiment, each memory cell of each logical page of memory cells are separated from each other by one memory cell from each of the other logical pages of memory cells. Thus, in such an embodiment, two memory cells of the same logical page and selected for programming will have three inhibited memory cells of other logical pages between them during a programming operation.

Figure 2:
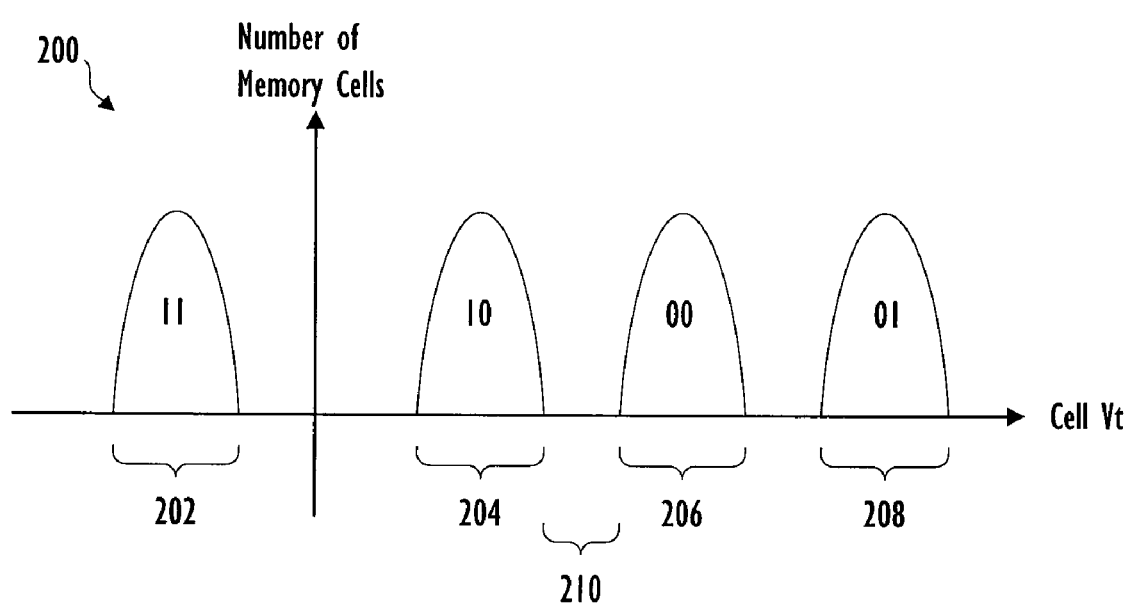
FIG. 2 shows a graphical representation of threshold voltage ranges in a population of memory cells.

It should be noted that although a particular logical page of memory cells might be selected for programming, one or more memory cells of the selected logical page may also be inhibited from programming depending on the intended programming level of each of the memory cells. For example, memory cells $420_{1,4,7}$ might comprise a logical page selected for programming. However, the intended programming level of memory cell $420_1$ might comprise one of the programming levels 204-208 as shown in FIG. 2 and memory cells $420_{4,7}$ might have intended programming levels 202, for example. Thus, although the logical page of memory cells might be selected for programming, memory cells $420_{4,7}$ would be inhibited from programming due to their intended programming levels, for example. Also, as memory cells of a selected logical page of memory cells begin to reach their intended programming levels during the application of one or more programming pulses, these memory cells may change from a selected (e.g., enabled) state to an inhibited state. Thus, according to one or more embodiments of the present disclosure, two memory cells of the same logical page selected for programming (e.g., Page 0 selected and Pages 1 and 2 inhibited) might have more than two inhibited memory cells between them during a programming operation.

Figure 5:
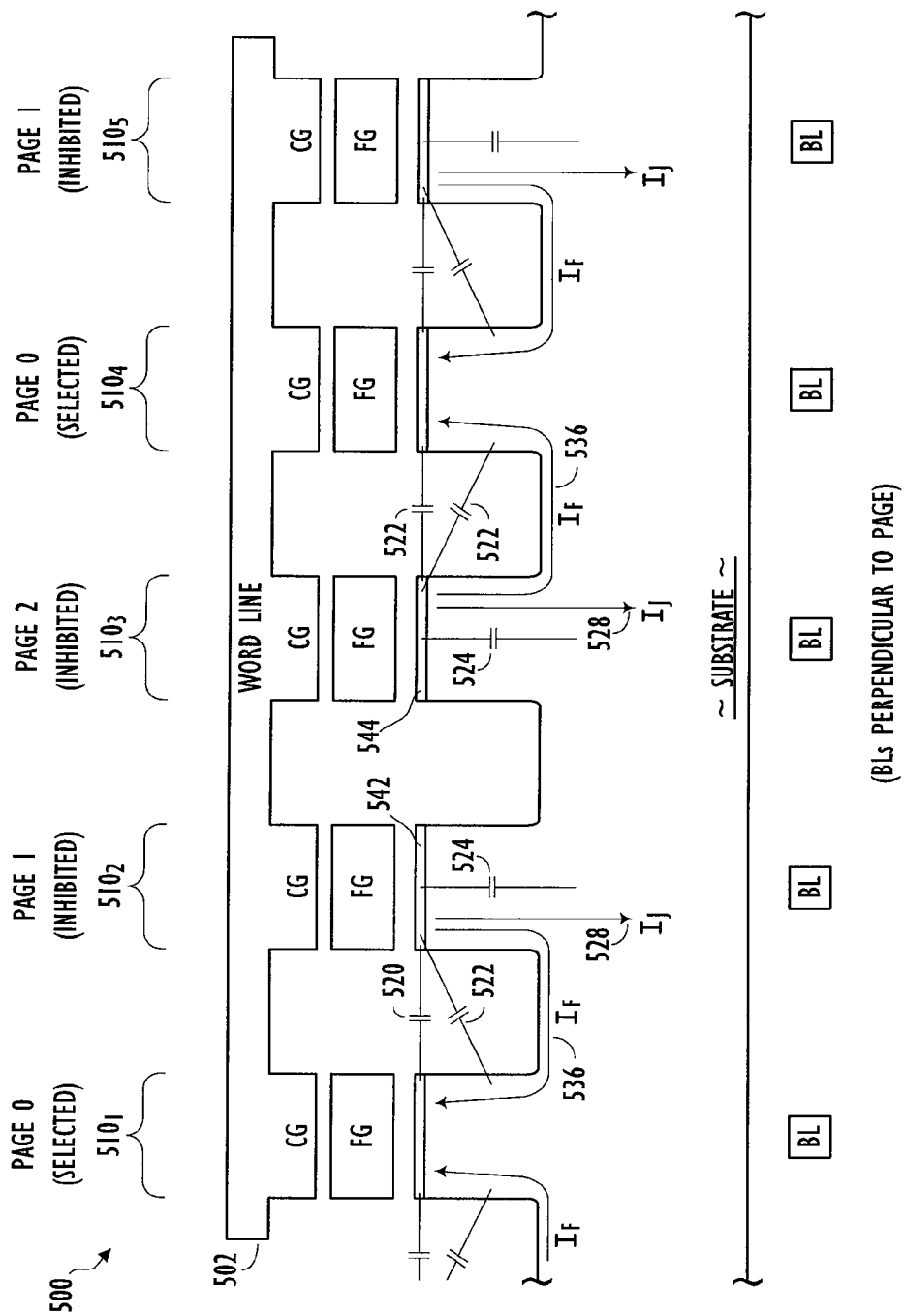
FIG. 5 shows parasitic effects which might occur in an array of flash memory cells according to an embodiment of the present disclosure.

FIG. 5 illustrates example programming conditions during a programming operation according to one or more embodiments of the present disclosure wherein Page 0 memory cells $510_{1,4}$ are selected for programming and Page 1 $510_{2,5}$ and Page 2 $510_3$ memory cells are inhibited from programming. It should be noted that FIG. 5 has been simplified in order to improve readability of the Figure and that many more memory cells may be coupled to the word line 502. Additionally, some structural regions of the memory cells 510 (e.g., source/drain regions) have been omitted to improve readability of the Figure. In addition, memory cells of NAND strings which are not coupled to the row selected for programming are also not shown in FIG. 5. Thus, FIG. 5 is intended to focus on the memory cells of a single row of memory cells selected for programming, such as WL4 $418_4$, for example.

FIG. 5 illustrates that one or more of the parasitic capacitances and parasitic currents discussed with respect to FIG. 3 and imposed on inhibited memory cells might be reduced with the benefit of one or more embodiments of the present disclosure. FIG. 3 illustrates that inhibited memory cells experience these parasitic capacitances and currents due to the selected memory cells on either side of an inhibited memory cell. For example, memory cell $310_2$ experiences parasitic capacitances 320, 322, 324, 330 and 332 and parasitic currents 328, 336 and 338 due to the two adjacent selected memory cells $310_{1,3}$, for example.

In contrast with FIG. 3, FIG. 5 illustrates that with the benefit of one or more embodiments of the present disclosure the parasitic capacitances and parasitic currents each inhibited memory cell experiences might be reduced by approximately half as a result of each inhibited cell being adjacent to another inhibited memory cell, for example, compared to situations where an inhibited memory cell is adjacent two selected memory cells. As discussed above, the channel region of inhibited memory cells might exhibit a potential of 6-10V. According to one or more embodiments of the present disclosure, it can be seen in FIG. 5 that by ensuring that at least two inhibited (e.g., not selected for programming) memory cells (e.g., $510_{2,3}$) exist between memory cells selected for programming (e.g., $510_{1,4}$) that the parasitic effects experienced by the two or more inhibited memory cells is substantially reduced, such as by approximately half, for example. This is because as discussed above, the channel regions of the inhibited memory cells are approximately 6-10V. Thus, the potential difference between the channel regions (e.g., 542 and 544) of the inhibited memory cells $510_{2,3}$ is at or near zero. Thus, the parasitic effects between the inhibited memory cells $510_{2,3}$ are significantly reduced.

FIG. 5 illustrates that due to the similar potential of the channel regions of adjacent inhibited memory cells, that the parasitic effects might be reduced by half as the parasitic effects (e.g., 520, 522, 524, 528, 536) only exist on one side of each inhibited cell and not between the two inhibited memory cells as shown in FIG. 5, for example. Thus, the potential program disturb effects that the inhibited memory cells might experience during a programming operation might be significantly reduced when methods according to one or more embodiments of the present disclosure are utilized. It is recognized that adjacent inhibited memory cells will not likely experience identical biases during operation and that there will be at least some parasitic effects between adjacent inhibited memory cells. However, such parasitic effects between adjacent inhibited memory cells will be generally insignificant relative to parasitic effects between an inhibited memory cell and a selected memory cell such that they can be ignored for practical purposes.

Figure 6:
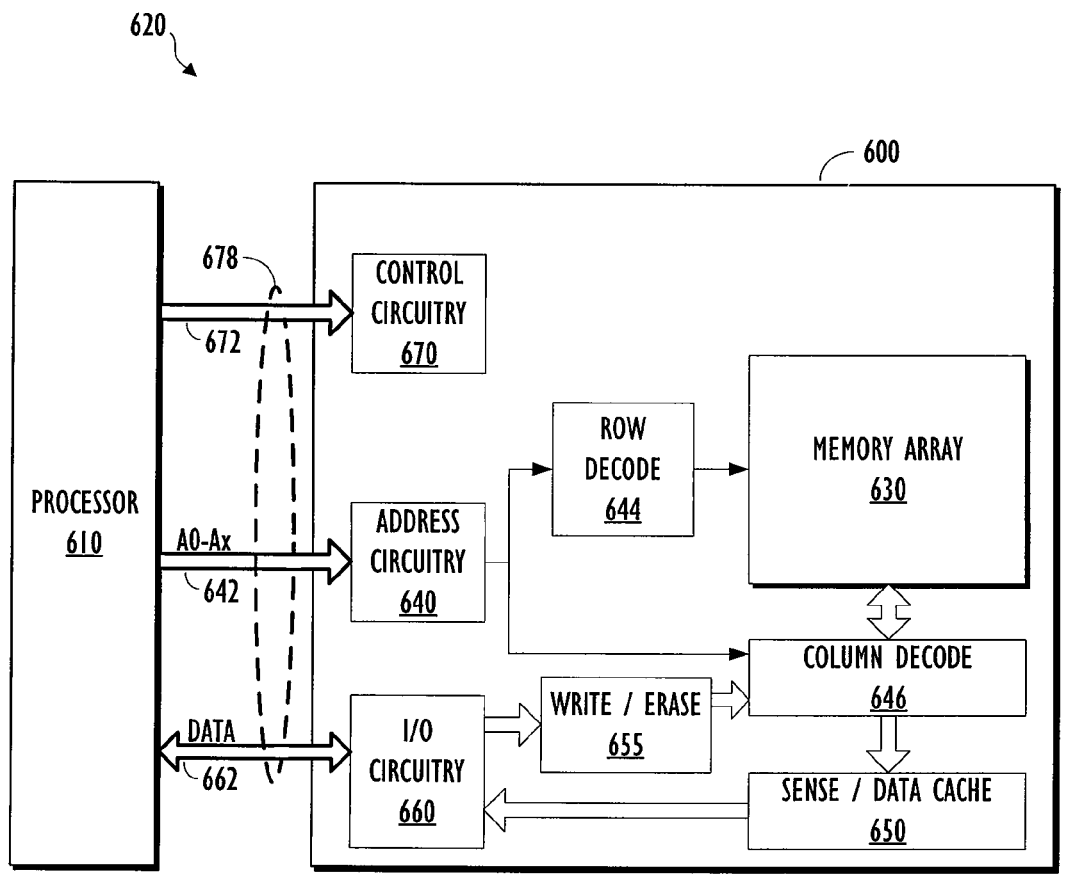
FIG. 6 illustrates a functional block diagram of a system according to an embodiment of the present disclosure.

FIG. 6 is a functional block diagram of an electronic system having at least one memory device according to one or more embodiments of the present disclosure. The memory device 600 illustrated in FIG. 6 is coupled to a host such as a processor 610. The processor 610 may be a microprocessor or some other type of controlling circuitry. The memory device 600 and the processor 610 form part of an electronic system 620. The memory device 600 has been simplified to focus on features of the memory device that are helpful in understanding various embodiments of the present disclosure.

The memory device 600 includes one or more arrays of memory cells 630 that can be logically arranged in banks of rows and columns. Memory array 630 may comprise SLC and/or MLC memory, for example. According to one or more embodiments, the memory cells of memory array 630 are flash memory cells. The memory array 630 might include multiple banks and blocks of memory cells residing on a single or multiple die as part of the memory device 600. The memory cells of the memory array 630 may also be adaptable to store varying densities (e.g., MLC(four level) and MLC (eight level)) of data in each cell, for example.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections 642 depends on the density and architecture of the memory array 630. That is, the number of address digits increases with both increased memory cell counts and increased bank and block counts, for example.

The memory device 600 reads data in the memory array 630 by sensing voltage or current changes in the memory array columns using sense/data cache circuitry 650. The sense/data cache circuitry 650, in at least one embodiment, is coupled to read and latch a row of data from the memory array 630. Sense devices 130 such as those discussed with respect to FIG. 1 can also comprise the sense/data cache circuitry 650, for example. Data input and output buffer circuitry 660 is included for bi-directional data communication over a plurality of data connections 662 with the processor 610. Write circuitry 655 is provided to write data to the memory array 630.

Control circuitry 670 is configured at least in part to implement various embodiments of the present disclosure, such as facilitating the methods discussed above with respect to FIGS. 4 and 5, for example. In at least one embodiment, the control circuitry 670 may utilize a state machine. Control signals and commands can be sent by the processor 610 to the memory device 600 over the command bus 672. The command bus 672 may be a discrete signal or may be comprised of multiple signals, for example. These command signals 672 are used to control the operations on the memory array 630, including data read, data write (e.g., program), and erase operations. The command bus 672, address bus 642 and data bus 662 may all be combined or may be combined in part to form a number of standard interfaces 678. For example, the interface 678 between the memory device 600 and the processor 610 may be a Universal Serial Bus (USB) interface. The interface 678 may also be a standard interface used with many hard disk drives (e.g., SATA, PATA) as are known to those skilled in the art.

The electronic system illustrated in FIG. 6 has been simplified to facilitate a basic understanding of the features of the memory and is for purposes of illustration only. A more detailed understanding of internal circuitry and functions of non-volatile memories are known to those skilled in the art.

Conclusion

In summary, one or more embodiments of the present invention provide a method of inhibiting memory cells in a memory device such that at least two inhibited memory cells are present between memory cells selected for programming where the inhibited and selected memory cells are from the same row of memory cells. These methods facilitate a reduction in the effects of program disturb on inhibited memory cells during a programming operation performed on selected memory cells in the same row as the inhibited memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for operating a memory device having a plurality of memory cells logically arranged in rows and columns, the method comprising:
   selecting one or more memory cells of a particular row to be programmed; and
   inhibiting two ore more adjacent memory cells of the particular row from programming;
   wherein any two memory cells of the particular row that are selected for programming are separated by two or more inhibited adjacent memory cells therebetween, regardless of an intended pattern of data values to be programmed into the particular row; and
   wherein inhibiting the two or more adjacent memory cells comprises biasing a first data line coupled to a first inhibited memory cell to a first inhibit voltage and biasing a second data line coupled to a second inhibited memory cell to a second inhibit voltage where the first inhibit voltage and the second inhibit voltage are different.

2. The method of claim 1, wherein selecting one or more memory cells further comprises enabling one or more memory cells where any two enabled memory cells of the particular row are separated by two or more inhibited adjacent memory cells regardless of the intended pattern of data values to be programmed into the particular row.

3. The method of claim 1, wherein any inhibited memory cell of the particular row has no more than one of the memory cells adjacent to it in the particular row selected for programming regardless of an intended pattern of data values to be programmed into the particular row.

4. The method of claim 1, wherein selecting one or more memory cells for programming further comprises biasing a data line coupled to the one or more selected memory cells at a potential to enable programming.

5. The method of claim 1, wherein the first inhibit voltage comprises a supply voltage.

6. The method of claim 1, further comprising applying one or more programming pulses to the particular row of memory cells.

7. A method for operating a memory device having a plurality of memory cells logically arranged in rows and columns, each row comprising three or more logical pages of memory cells where each memory cell of each logical page of memory cells of a particular row of memory cells is separated by a memory cell of each of the other logical pages of memory cells of the particular row of memory cells, the method comprising:
   selecting one or more memory cells of a selected logical page of a selected row of memory cells for programming;
   inhibiting remaining memory cells of the selected logical page of the selected row of memory cells from programming;
   inhibiting memory cells of remaining logical pages of memory cells of the selected row of memory cells from programming; and
   applying one or more programming pulses to the selected row of memory cells;
   wherein inhibiting memory cells of remaining logical pages comprises biasing a first data line coupled to a first inhibited memory cell to a first inhibit voltage and biasing a second data line coupled to a second inhibited memory cell to a second inhibit voltage where the first inhibit voltage and the second inhibit voltage are different.

8. The method of claim 7, wherein inhibiting memory cells of remaining logical pages of memory cells of the selected row of memory cells from programming further comprises inhibiting memory cells of remaining logical pages of memory cells where each inhibited memory cell of a remaining logical page of memory cells is adjacent to no more than one memory cell of the selected logical page of memory cells.

9. A memory device, comprising:
   an array of memory cells logically arranged in rows and columns where each row of cells is coupled to an access line and each row further comprises three or more logical pages of memory cells where each memory cell of each logical page of memory cells of a particular row of memory cells is separated by a memory cell from each of the other logical pages of memory cells of the particular row;
   a plurality of data lines each coupled to a respective column of memory cells; and
   control circuitry, wherein during a program operation on a first logical page of memory cells of a selected row of memory cells, the control circuitry is configured to bias data lines coupled to one or more memory cells of the first logical page of memory cells in a one-to-one relationship to a first voltage, bias data lines coupled to remaining memory cells of the first logical page of memory cells in a one-to-one relationship to a second voltage, bias one or more data lines coupled to memory cells of one or more of the other logical pages of memory cells of the selected row of memory cells in a one-to-one relationship to the second voltage, bias one or more data lines coupled to memory cells of one or more of the other logical pages of memory cells of the selected row of memory cells in a one-to-one relationship to a third voltage, and apply a fourth voltage to an access line couple to the selected row or memory cells;
   wherein the first voltage is a potential to enable programming of memory cells coupled to the access line and to a data line receiving the first voltage;
   wherein the second voltage is a potential to inhibit programming of memory cells coupled to the access line and to a data line receiving the second voltage
   wherein the third voltage is a potential to inhibit programming of memory cells coupled to the access line and to a data line receiving the third voltage; and
   wherein the second and the third voltages are different.

10. The memory device of claim 9, wherein each memory cell of the first logical page of memory cells comprises every third memory cell along the particular row of memory cells.

11. The memory device of claim 10, wherein each memory cell of the first logical page of memory cells is separated by one memory cell of a second logical page of memory cells and one memory cell of a third logical page of memory cells.

* * * * *

UNITED STATES PATENT AND TRADEMARK OFFICE
CERTIFICATE OF CORRECTION

PATENT NO.        : 7,978,511 B2
APPLICATION NO.   : 12/473636
DATED             : July 12, 2011
INVENTOR(S)       : Andrew Bicksler Page 1 of 1

It is certified that error appears in the above-identified patent and that said Letters Patent is hereby corrected as shown below:

In column 10, line 51, in Claim 1, delete "ore" and insert -- or --, therefor.

In column 12, line 36, in Claim 9, after "voltage" insert -- ; --.

Signed and Sealed this
Sixth Day of September, 2011

David J. Kappos
*Director of the United States Patent and Trademark Office*